(12) United States Patent
Katayama

(10) Patent No.: US 11,373,961 B1
(45) Date of Patent: Jun. 28, 2022

(54) STEM FOR SEMICONDUCTOR PACKAGE

(71) Applicant: SHINKO ELECTRIC INDUSTRIES CO., LTD., Nagano (JP)

(72) Inventor: Wataru Katayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/153,004

(22) Filed: Jan. 20, 2021

(30) Foreign Application Priority Data

Dec. 8, 2020 (JP) .............................. JP2020-203393

(51) Int. Cl.
| | |
|---|---|
| *H01L 23/495* | (2006.01) |
| *H01L 23/48* | (2006.01) |
| *H01L 21/00* | (2006.01) |
| *H01L 23/00* | (2006.01) |
| *H01L 23/049* | (2006.01) |
| *H01L 23/045* | (2006.01) |
| *H01L 23/055* | (2006.01) |
| *H01L 23/498* | (2006.01) |

(52) U.S. Cl.
CPC .......... *H01L 23/562* (2013.01); *H01L 23/045* (2013.01); *H01L 23/049* (2013.01); *H01L 23/055* (2013.01); *H01L 23/49503* (2013.01); *H01L 23/49558* (2013.01); *H01L 23/49568* (2013.01); *H01L 23/49811* (2013.01); *H01L 23/49827* (2013.01); *H01L 24/49* (2013.01)

(58) Field of Classification Search
CPC ... H01L 23/045; H01L 23/481; H01L 23/055; H01L 23/049; H01L 24/49; H01L 23/562; H01L 23/49503; H01L 23/49558; H01L 23/49568; H01L 23/49827; H01L 23/49811
See application file for complete search history.

(56) References Cited

U.S. PATENT DOCUMENTS

| | | | | |
|---|---|---|---|---|
| 7,166,873 | B2 * | 1/2007 | Okazaki | H01S 5/0071 257/E33.059 |
| 10,945,337 | B2 * | 3/2021 | Ikeda | H05K 1/116 |
| 2010/0252856 | A1 * | 10/2010 | Yuang | G02B 6/4201 257/E31.11 |
| 2016/0006210 | A1 * | 1/2016 | Noguchi | H01L 31/024 257/459 |

FOREIGN PATENT DOCUMENTS

JP     2004-235212     8/2004

* cited by examiner

*Primary Examiner* — Alonzo Chambliss
(74) *Attorney, Agent, or Firm* — IPUSA, PLLC

(57) ABSTRACT

A stem for a semiconductor package, includes a plate, a frame, positioned on an outer periphery of the plate in a plan view, and bonded to the plate, and a lead terminal held in a state insulated from the plate and the frame. The plate protrudes from a top surface and a bottom surface of the frame, and a protruding amount of the plate from the top surface and a protruding amount of the plate from the bottom surface are the same.

14 Claims, 2 Drawing Sheets

STEM FOR SEMICONDUCTOR PACKAGE

CROSS-REFERENCE TO RELATED APPLICATION

This application is based upon and claims priority to Japanese Patent Application No. 2020-203393, filed on Dec. 8, 2020, the entire contents of which are incorporated herein by reference.

FIELD

Certain aspects of the embodiments discussed herein are related to stems for semiconductor packages.

BACKGROUND

A stem for a semiconductor package is used to mount a semiconductor device, such as a light emitting device or the like, in the semiconductor package. For example, a known structure for the stem includes a through hole is formed in a rectangular base, and a lead terminal is sealed inside the through hole using glass. The base has a device mounting surface on which the semiconductor device is mounted. After the mounting the semiconductor device on the device mounting surface of the base, the stem for the semiconductor package is electrically connected to the lead terminal, and a cap is bonded to a peripheral portion of the base by welding or the like, to form the semiconductor package (refer to Japanese Laid-Open Patent Publication No. 2004-235212, for example).

In the stem for the semiconductor package described above, the flatness of the base is important from a viewpoint of bonding the base and the cap while maintaining the airtightness. Hence, there are demands to reduce warping of the base in the stem for the semiconductor package.

SUMMARY

Accordingly, it is an object in one aspect of the embodiments to provide a stem for a semiconductor package, which can reduce warping of an object to which a cap is bonded.

According to one aspect of the embodiments, a stem for a semiconductor package, includes a plate; a frame, positioned on an outer periphery of the plate in a plan view, and bonded to the plate; and a lead terminal held in a state insulated from the plate and the frame, wherein the plate protrudes from a top surface and a bottom surface of the frame, and a protruding amount of the plate from the top surface and a protruding amount of the plate from the bottom surface are the same.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
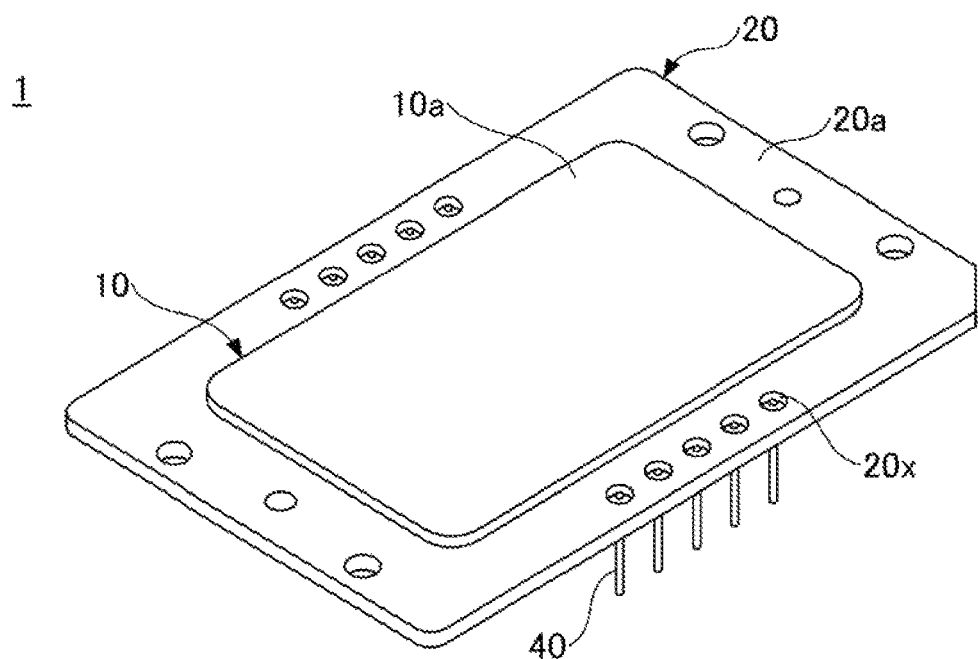
FIG. 1A and FIG. 1B are diagrams illustrating an example of a stem for a semiconductor package according to one embodiment.

Preferred embodiments of the present invention will be described with reference to the accompanying drawings. In the drawings, those parts that are the same are designated by the same reference numerals, and a repeated description of the same parts may be omitted.

A description will now be given of a stem for a semiconductor package, according to each embodiment of the present invention.

Figure 1B:
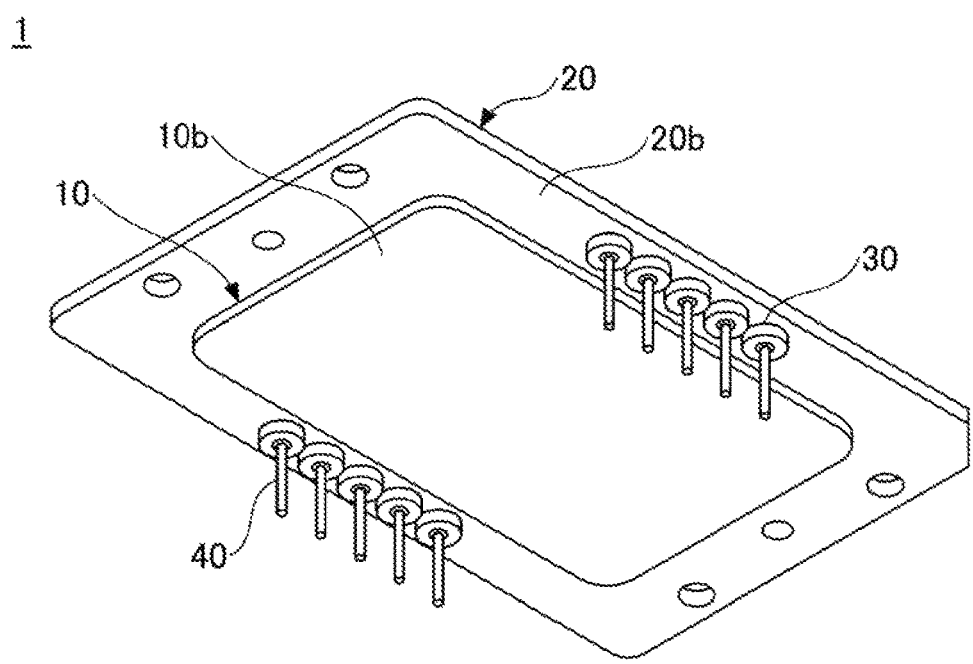
Figure 2A:
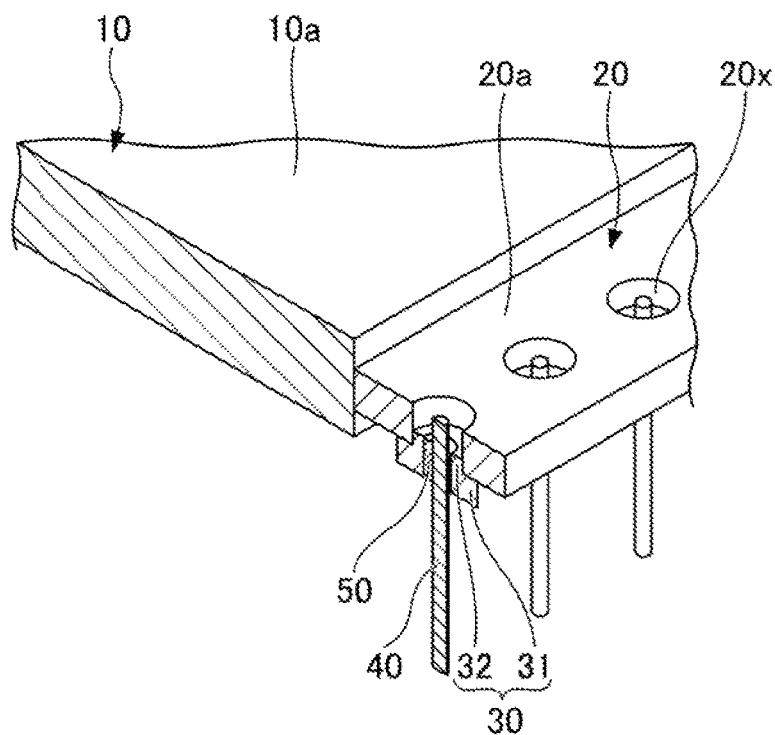
FIG. 2A and FIG. 2B are diagrams illustrating the example of the step for the semiconductor package according to one embodiment.
Figure 2B:
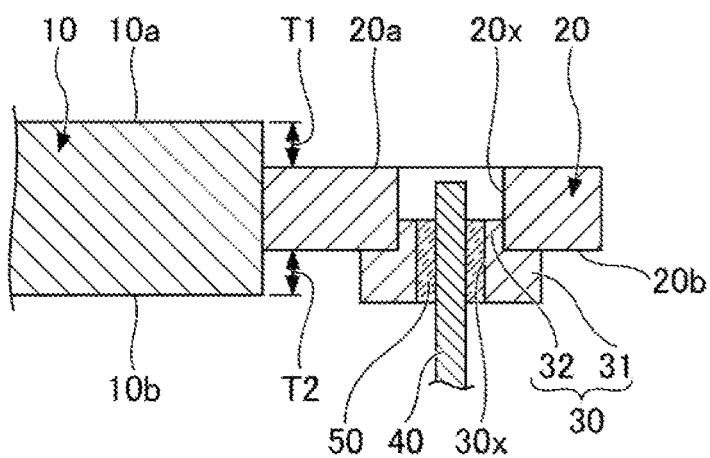

FIG. 1A, FIG. 1B, FIG. 2A, and FIG. 2B are diagrams illustrating an example of the stem for the semiconductor package according to one embodiment of the present embodiment. FIG. 1A is a perspective view viewed from a top of the stems, and FIG. 1B is a perspective view viewed from a bottom of the stems. FIG. 2A is a perspective view, in partial cross section, viewed from the top of the stems, and FIG. 2B is view, in partial cross section, illustrating the stem.

Referring to FIG. 1A through FIG. 2B, a stem 1 for a semiconductor package according to this embodiment includes a plate 10, a frame 20, a plurality of lead holding members 30, a plurality of lead terminals 40, and a plurality of sealing parts 50.

The plate 10 has a rectangular shape in a plan view, for example, and includes a top surface 10a and a bottom surface 10b. The plate 10 may have a length of approximately 40 mm to approximately 60 mm in a longitudinal direction, a length of approximately 20 mm to approximately 40 mm in a transverse (or short) direction, and thickness of approximately 3 mm to approximately 4 mm, for example.

A plurality of semiconductor devices, such as a semiconductor laser or the like, can be mounted on the top surface 10a of the plate 10. In other words, the top surface 10a of the plate 10 forms a device mounting surface on which a plurality of semiconductor devices can be mounted. The bottom surface 10b of the plate 10 may thermally connect to a heat sink or the like, and can be used as a heat dissipation (or heat sink) surface for dissipating the heat generated from the semiconductor device.

From a viewpoint of the heat dissipation of the mounted semiconductor device, a thermal conductivity of the plate 10 is preferably greater than a thermal conductivity of the frame 20. Ceramics or metals may be used as a material forming the plate 10, for example, but a metal is preferably used for the plate 10 in order to improve the heat dissipation. The metals preferably used for the plate 10 include copper, copper alloys, or the like, for example.

In this specification, a plan view of an object refers to the view of the object viewed from a normal direction with respect to the top surface 10a of the plate 10. Further, a planar shape of the object refers to the shape of the object in the plan view viewed from the normal direction with respect to the top surface 10a of the plate 10.

The frame 20 is positioned on an outer periphery of the plate 10 in the plan view, and is bonded to the plate 10. The frame 20 has a picture frame shape in the plan view, for example. An outer edge of the frame 20 may have a length of approximately 50 mm to approximately 70 mm in the longitudinal direction, a length of approximately 30 mm to approximately 50 mm in the transverse direction, and a thickness of approximately 1 mm to approximately 2 mm, for example. An inner edge of the frame 20 is determined according to the size of the plate 10, and has a size similar to the size of an outer edge of the plate 10. Metals such as iron, stainless steel, or the like may preferably be used as a material forming the frame 20, for example. For example, the entire inner side surface of the frame 20 is bonded to a side surface of the plate 10. A metal bonding material, for example, may be used to bond the inner side surface of the frame 20 to the side surface of the plate 10. An example of the metal bonding material includes silver braze, for example.

The frame 20 includes a plurality of through holes 20x which penetrate the frame 20 from a top surface 20a to a bottom surface 20b of the frame 20. The planar shape of the through holes 20x is a circular shape, for example, and a diameter of this circular shape is approximately 1.5 mm to approximately 3.0 mm, for example. The lead holding member 30 is bonded to the bottom surface 20b of the frame 20 near each of the through holes 20x. Metals such as iron, stainless steel, or the like, for example, may be used as a material forming the lead holding member 30. The frame 20 and the lead holding members 30 are preferably made of the same material, in order to reduce warping caused by a difference, in thermal expansions of the frame 20 and the lead holding member 30 during brazing.

The lead holding member 30 includes a cylindrical large diameter portion 31, and a cylindrical small diameter portion 32 having a diameter smaller than a diameter of the large diameter portion 31. The large diameter portion 31 and the small diameter portion 32 are formed concentrically. The small diameter portion 32 is inserted into the through hole 20x and bonded to the frame 20. More particularly, a side surface of the small diameter portion 32 and an inner side surface of the through hole 20x are bonded to each other, and a top surface of the large diameter portion 31 and the bottom surface 20b of the frame 20 are bonded to each other. A metal bonding material, for example, may be used to bond the frame 20 to the lead holding member 30. An example of the metal bonding material includes silver braze, for example.

The lead holding member 30 includes a through hole 30x which penetrates the large diameter portion 31 and the small diameter portion 32 in a thickness direction. The lead holding member 30 is fixed to the bottom surface 20b of the frame 20, so that the through hole 30x and the through hole 20x communicate with each other. The lead terminal 40 is inserted into the through hole 30x. The lead terminal 40 is held in a state insulated from the plate 10, the frame 20, and the lead holding member 30. More particularly, the lead terminal 40 is held inside the through hole 30x of the lead holding member 30, without making contact with the inner side surfaces of the through hole 20x and the through hole 30x. The lead terminal 40 electrically connects the semiconductor device mounted on the plate 10 to an external part (not illustrated). Nickel-cobalt ferrous alloys such as Kovar (registered trademark), iron-nickel alloys, or like, for example, may be used as a material forming the lead terminal 40.

An end of the lead terminal 40 may protrude from the through hole 30x. In addition, the end of the lead terminal 40 may protrude from the top surface 20a of the frame 20. However, from a viewpoint of shortening the length of the lead terminal 40, the lead terminal 40 is preferably held by the lead holding member 30 so as not to protrude from the top surface 20a of the frame 20. By shortening the length of the lead terminal 40, it is possible to reduce the resonance caused by an ultrasonic frequency which is likely generated when the semiconductor device mounted on the plate 10 and the lead terminals 40 are bonded by ultrasonic wire bonding. The lead holding member 30 may have a thickness of approximately 1 mm to approximately 3 mm, for example.

The lead terminals 40 can be held more rigidly, by making the thickness of the lead holding member 30 approximately 1 mm to approximately 3 mm.

The sealing part 50, made of an insulating material, is provided on an outer periphery of the lead terminal 40 inside the through hole 30x. In other words, the lead terminal 40 is held inside the through hole 30x of the lead holding member 30 via the insulating sealing part 50. Preferably, one through hole 30x is provided with respect to each of the plurality of lead terminals 40. Accordingly, a portion between the lead terminal 40 and the lead holding member 30 can be positively sealed by the insulating sealing part 50.

A glass material, for example, may be used as a material forming the sealing part 50. In order to seal the semiconductor device mounted on the plate 10 airtight, the material forming the sealing part 50 preferably has a coefficient of thermal expansion relatively close to coefficients of thermal expansion of the lead holding member 30 and the lead terminal 40. An example of such a material includes borosilicate glass, for example.

In the stem 1 for the semiconductor package, the plate 10 is formed to be thicker than the frame 20. The top surface 10a of the plate 10 protrudes from the top surface 20a of the frame 20, and the bottom surface 10b of the plate 10 protrudes from the bottom surface 20b of the frame 20. For example, the entire top surface 10a of the plate 10 protrudes from the top surface 20a of the frame 20, and the entire bottom surface 10b of the plate 10 protrudes from the bottom surface 20b of the frame 20.

A protruding amount T1 of the top surface 10a of the plate 10 from the top surface 20a of the frame 20 is the same as a protruding amount T2 of the bottom surface 10b of the plate 10 from the bottom surface 20b of the frame 20. Protruding amounts T1 and T2 are in a range of approximately 0.5 mm to approximately 1.5 mm, for example. In this specification, when the protruding amount T1 and the protruding amount T2 are described as being the same, it is referring to a case where the protruding amount T2 falls within a range of the protruding amount T1±100 μm. In order to make the protruding amount T1 and the protruding amount T2 the same, a dedicated jig having a high dimensional accuracy may be used for the bonding between the plate 10 and the frame 20.

After the mounting the semiconductor device on the top surface 10a (that is, the device mounting surface) of the plate 10, the stem 1 for the semiconductor package is electrically connected to the lead terminal 40, and a cap (not illustrated) is bonded to the top surface 20a of the frame 20 by welding or the like, to form the semiconductor package. In this case, the warping of the plate 10 and the frame 20 may cause a problem. If the warping of the plate 10 and the frame 20 is large, it becomes difficult to bond the cap to the top surface 20a of the frame 20 by the welding or the like.

For consideration purposes, the present inventor made a comparative stem A for a semiconductor package, by replacing the frame with a rectangular second plate larger than the plate, and bonding a rectangular plate on the second plate, to expose an outer periphery of the second plate around the plate. The plate was made of copper, the second plate was made of iron, and the lead terminal was sealed inside a through hole provided in the outer periphery of the second plate, using glass. In the stem A for the semiconductor package, the warping of the plate and the second plate was approximately 200 μm. In this state, it was difficult to bond the second plate and the cap while maintaining airtightness.

Next, the present inventor made a stem B for a semiconductor package having a structure similar to that of the stem 1 for the semiconductor package described above, by making the plate protrude from the top surface and the bottom surface of the frame, and making the protruding amount of the plate from the top surface of the frame the same as the protruding amount of the plate from the bottom surface of the frame. However, in the stem B for the semiconductor package, the lead terminal was sealed inside the through hole provided in the frame, using glass, but without using the lead holding member. In stem B for the semiconductor package, the materials used for the plate and the frame, and the thickness of frame material, were the same as those of the stem A for the semiconductor package, and the thickness of the plate was set so that the protruding amount from the top and bottom surfaces of the frame becomes 1 mm. In stem B for the semiconductor package, the warping of the plate and frame was approximately 100 μm. In this state, it was possible to bond the frame and the cap while maintaining airtightness.

Next, the present inventor made the stem 1 for the semiconductor package. The stem 1 for the semiconductor package was made under the same conditions as the stem B for the semiconductor package, except that the lead terminal 40 was sealed inside the through hole 20x provided in the frame 20, using glass and using the lead holding member 30 made of iron. In the stem 1 for the semiconductor package, the warping of the plate 10 and the frame 20 was 50 μm or less. In this state, it was possible to bond the frame 20 and the cap while maintaining airtightness, and the airtightness was further improved.

The warping was evaluated by measuring irregularities using a non-contact three-dimensional measuring machine. More particularly, a difference between a lowest point of a height of the plate and a highest point of height of the plate was measured, to determine a magnitude of the warping of the plate. Similarly, a difference between a lowest point of a height of the frame and a highest point of the height of the frame was measured, to determine a magnitude of the warping of the frame.

Generally, in the stem for the semiconductor package, the plate is designed with emphasis on the heat dissipation, while the frame is designed with emphasis on, the airtightness utilizing the difference between the coefficients of thermal expansion of the frame and the sealing part which seals the lead terminal. Accordingly, different materials are used for the plate and the frame. For this reason, stress is generated by the brazing performed at approximately 800° C., for example, due to the difference between the coefficients of thermal expansion of the plate and the frame, thereby generating the warping.

However, according to the structure of the stem 1 for the semiconductor package, the plate 10 protrudes from the top surface 20a and the bottom surface 20b of the frame 20, and the protruding amount T1 from the top surface 20a and the protruding amount T2 from the bottom surface 20b are the same, thereby improving a balance above and below the frame 20. For this reason, it may be regarded that the stress caused by the difference between the coefficients of thermal expansion of the plate 10 and the frame 20 is relaxed, and the warping is reduced, thereby enabling the bonding of the frame 20 and the cap.

In the stem 1 for the semiconductor package, one lead terminal 40 is inserted into one lead holding member 30. For example, it is conceivable to form the lead holding member from a single plate having a plurality of through holes, and to insert the plurality of lead terminals 40 into the plurality of through holes, respectively. However, in this conceivable case, the plate shaped lead holding member and the frame 20 would require a large area to be bonded by the brazing, thereby adversely affecting the warping of the frame 20, that is, increasing the warping of the frame 20. On the contrary, by inserting one lead terminal 40 into one lead holding member 30 as in the stem 1 for the semiconductor package, the area of the lead holding member 30 and the frame 20 to be bonded by the brazing can be reduced, thereby reducing the adverse effects on the warping of the frame 20.

Although the preferred embodiments have been described in detail above, various variations, modifications, and substitutions may be made to the embodiments described above without departing from the scope of the present disclosure.

According to each of the embodiments, it is possible to provide a stem for a semiconductor package, which can reduce warping of an object to which a cap is bonded.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A stem for a semiconductor package, comprising:
   a plate having a rectangular shape in a plan view;
   a frame having a picture frame shape in the plan view, the frame being positioned on an outer periphery of the plate in the plan view and bonded to the plate; and
   a lead terminal held in a state insulated from the plate and the frame,
   wherein the plate protrudes from a top surface and a bottom surface of the frame, and a protruding amount of the plate from the top surface and a protruding amount of the plate from the bottom surface are the same.

2. The stem for the semiconductor package as claimed in claim 1, wherein
   an entire inner side surface of the frame is bonded to a side surface of the plate.

3. The stein for the semiconductor package as claimed in claim 1, wherein an entire top surface of the plate protrudes from the top surface of the frame, and an entire bottom surface of the plate protrudes from the bottom surface of the frame.

4. The stem for the semiconductor package as claimed in claim 3, further comprising:
   a first through hole penetrating the frame; and
   a lead holding member having a second through hole,
   wherein the lead holding member is fixed to the bottom surface of the frame so that the second through hole communicates with the first through hole, and
   wherein the lead terminal is held inside the second through hole without making contact with inner side surfaces of the first through hole and the second through hole, respectively.

5. The stem for the semiconductor package as claimed in claim 4, wherein an end of the lead terminal is held by the lead holding member so as not to protrude from the top surface of the frame.

6. The stem for the semiconductor package as claimed in claim 4, wherein the lead terminal is held inside the second through hole via an insulating sealing part.

7. The stem for the semiconductor package as claimed in claim 4, wherein the frame and the lead holding member are made of the same material.

8. The stem for the semiconductor package as claimed in claim 4, wherein the plate and the frame are made of metals, respectively, and a thermal conductivity of the plate is greater than a thermal conductivity of the frame.

9. The stem for the semiconductor package as claimed in claim 1, further comprising:
   a first through hole penetrating the frame; and
   a lead holding member having a second through hole,
   wherein the lead holding member is fixed to the bottom surface of the frame so that the second through hole communicates with the first through hole, and
   wherein the lead terminal is held inside the second through hole without making contact with inner side surfaces of the first through hole and the second through hole, respectively.

10. The stem for the semiconductor package as claimed in claim 9, wherein an end of the lead terminal is held by the lead holding member so as not to protrude from the top surface of the frame.

11. The stem for the semiconductor package as claimed in claim 9, wherein the lead terminal is held inside the second through hole via an insulating sealing part.

12. The stem for the semiconductor package as claimed in claim 9, wherein the frame and the lead holding member are made of the same material.

13. The stem for the semiconductor device as claimed in claim 9, wherein
   the lead holding member includes a first portion, a second portion having a diameter smaller than a diameter of the first portion, and the second through hole penetrating the first portion and the second portion,
   the first portion and the second portion are formed concentrically,
   the second portion is inserted into the first through hole and bonded to the frame, and
   a top surface of the first portion and the bottom surface of the frame are bonded to each other.

14. The stem for the semiconductor package as claimed in claim 1, wherein the plate and the frame are made of metals, respectively, and a thermal conductivity of the plate is greater than a thermal conductivity of the frame.

* * * * *